United States Patent [19]

Bayraktaroglu

[11] Patent Number: 5,648,294
[45] Date of Patent: Jul. 15, 1997

[54] INTEGRATED CIRCUIT AND METHOD

[75] Inventor: Burhan Bayraktaroglu, Plano, Tex.

[73] Assignee: Texas Instruments Incorp., Dallas, Tex.

[21] Appl. No.: 473,796

[22] Filed: Jun. 7, 1995

Related U.S. Application Data

[62] Division of Ser. No. 179,238, Jan. 10, 1994, which is a division of Ser. No. 649,378, Jan. 31, 1991, Pat. No. 5,283,448, which is a continuation of Ser. No. 443,295, Nov. 29, 1989, abandoned.

[51] Int. Cl.$^6$ ................................................ H01L 21/20
[52] U.S. Cl. .................... 437/126; 437/133; 437/912; 437/31; 437/32
[58] Field of Search ............................ 437/133, 126, 437/912, 31, 32

[56] References Cited

U.S. PATENT DOCUMENTS

| | | | |
|---|---|---|---|
| 4,939,562 | 7/1990 | Adlerstein | 257/198 |
| 5,021,361 | 6/1991 | Kinoshita et al. | 437/129 |
| 5,206,524 | 4/1993 | Chen et al. | 257/29 |

FOREIGN PATENT DOCUMENTS

| | | |
|---|---|---|
| 0244065 | 12/1985 | Japan . |
| 0072158 | 4/1988 | Japan . |
| 0200565 | 8/1988 | Japan . |

*Primary Examiner*—Trung Dang
*Attorney, Agent, or Firm*—W. Daniel Swayze, Jr.; W. James Brady, III; Richard L. Donaldson

[57] ABSTRACT

Heterojunction bipolar transistors (130) with bases (138) including an etch stop element are disclosed. The preferred embodiment devices have $Al_zGa_{1-z}As$ emitters (140) and GaAs collectors (136) and bases (138) with $In_yGa_{1-y}As$ added to the bases (138) to stop chloride plasma etches.

2 Claims, 7 Drawing Sheets

INTEGRATED CIRCUIT AND METHOD

This is a Divisional of application Ser. No. 08/179,238, filed 01/10/94; which is a Divisional of application Ser. No. 07/649,378 filed Jan. 31, 1991 now U.S. Pat. No. 5,283,448; which is a Continuation of application Ser. No. 07/443,295 filed Nov. 29, 1989 now abandoned.

CROSS-REFERENCE TO RELATED APPLICATIONS

U.S. patent application Ser. Nos. 834,708, filed Feb. 28, 1986 (Kim); 063,554, filed Jun. 18, 1987 (Tran); 067,527, filed Jun. 26, 1987 (Bayraktaroglu); 107,234, filed Oct. 9, 1987 (Plumton et al); 312,100, filed Feb. 16, 1989 (Bayraktaroglu); and 312,101, filed Feb. 16, 1989 (Morris et al) disclose related subject matter. All of these cross-reference items are assigned to the assignee of this application.

BACKGROUND OF THE INVENTION

1. Field of the Invention

The present invention relates to semiconductor electronic integrated circuits and fabrication methods, and, more particularly, to integrated circuits made of III–V compound semiconductors including heterostructure devices such as heterojunction bipolar transistors.

2. Description of the Related Art

Semiconductor devices made of gallium arsenide (GaAs) are preferred over devices made of silicon for high frequency applications due to the higher mobility of carriers in gallium arsenide; however, gallium arsenide material and fabrication technology lag far behind that of silicon. For example, gallium arsenide metal-semiconductor field effect transistor (MESFET) integrated circuits with more than a 1,000 gates have been fabricated (see, Toyoda et al, A 42ps 2K-Gate GaAs Gate Array, 1995 ISSCC Dig, Tech. Papers 206), but the precise control of device parameters such as threshold voltage for larger scale integration has not yet been achieved. Similarly, high electron mobility transistors (HEMTs), which are MESFETs that use the two dimensional electron gas at a heterojunction such as at an interface of gallium arsenide and aluminum gallium arsenide, provide fast devices but suffer from the lack of precise control of device parameters; see Mimura et al, High Electron Mobility Transistors for LSI Circuits, 1983 IEDM Tech Digest 99.

Bipolar transistors have several advantages over MESFETs for high speed, large scale integration applications; for example, the turn-on voltage is determined by physical parameters and is not sensitive to the geometry and doping levels as is the threshold voltage of MESFETs or HEMTs. However, the fabrication of gallium arsenide bipolar (or heterojunction bipolar) transistors suitable for high speed applications, such as ECL, is complicated by the need for both a thin base and low base resistance. Indeed, as given by S. Sze, Physics of Semiconductor Devices §3.3 (Wiley-Interscience, 2d. Ed. 1981), the maximum frequency of oscillation is:

$$f_{max} = \sqrt{\frac{f_T}{8\pi\tau_b C_c}}$$

where $f_T$ is the current-gain cutoff frequency, $Y_b$ is the effective base resistance, and $C_c$ is the effective collector capacitance. The cutoff frequency, in turn, is related to the emitter-to-collector delay time $\tau_{ec}$ by $$f_T = \frac{1}{2\pi\tau_{ec}},$$

and $\tau_{ec}$ decreases with decreasing base thickness. Thus there is a need for a base that is simultaneously thin and of low resistance.

H. Kroemer, RCA Rev. 332 (September 1957), suggested a graded composition base, which has a graded bandgap to provide a built-in quasielectric field through the base, to accelerate injected carriers in the base to the collector. This improves the high speed performance of a bipolar transistor but does not address the problem of lowering the base resistance for a given base thickness.

Furthermore, a thin base aggravates the problems of fabrication and high base contact resistance because an etch must stop at the base and not penetrate it. The usual etches for GaAs (wet etches such as hydrogen peroxide plus sulfuric acid in water and dry etches such as plasmas and reactive ion etching (RIE) with chlorine compounds like $CCl_2F_2$ and $BCl_3$) are not very selective with regard to doping type. Most wet chemical etches, such as hydrogen peroxide plus ammonium hydroxide, and RIE etches, such as $Cl_2$ and $CCl_2F_2$, etch GaAs faster than $Al_xGa_{1-x}As$. In the fabrication of HBTs a selective etching of both GaAs and $Al_xGa_{1-x}As$ (with $x \leq 0.3$) is required; and RIE with $BCl_3$ has a weak AlAs mole fraction dependence in etching $A_xGa_{1-x}As$. See, for example, Cooperman et al, Reactive Ion Etching of GaAs and Al-GaAs in a $BCl_3$-Ar Discharge, 7 J. Vac. Sci. Tech. B 41 (1989). Thus there is a problem of etching in fabrication of HBTs with $Al_xGa_{1-x}As$.

SUMMARY OF THE INVENTION

The present invention provides an etch-stop layer and devices including such a layer made of III–V semiconductor materials and related etching methods. Preferred embodiment devices include heterojunction bipolar transistors (HBTs) with $Al_xGa_{1-x}As$ emitter and GaAs base plus an $In_yGa_{1-y}As$ etch stop layer at or near the hetero junction or just an $In_yGa_{1-y}As$ base. Also, other preferred embodiment devices include MESFETs and HEMTs with an $In_yGa_{1-y}As$ etch-stop layer to define the channel thickness under the gate (which overcomes the threshold control problem) and tunneling devices with $Al_xGa_{1-x}As$ tunneling barriers and $In_yGa_{1-y}As$ quantum wells which have the quantum well coinciding with the etch stop layer. The preferred embodiment etches include plasma etching with chlorides.

This solves the problems of selectively removing the emitter to make contact to the base in HBTs by a highly selective etching process, and additionally the incorporation of In into the base lowers the surface potential of metal contacts and improves ohmic contact properties. For MESFETs and HEMTS this also solves the threshold uniformity problem.

BRIEF DESCRIPTION OF THE DRAWINGS

The drawings are all schematic for clarity.

DESCRIPTION OF THE PREFERRED EMBODIMENTS

Figure 1A:
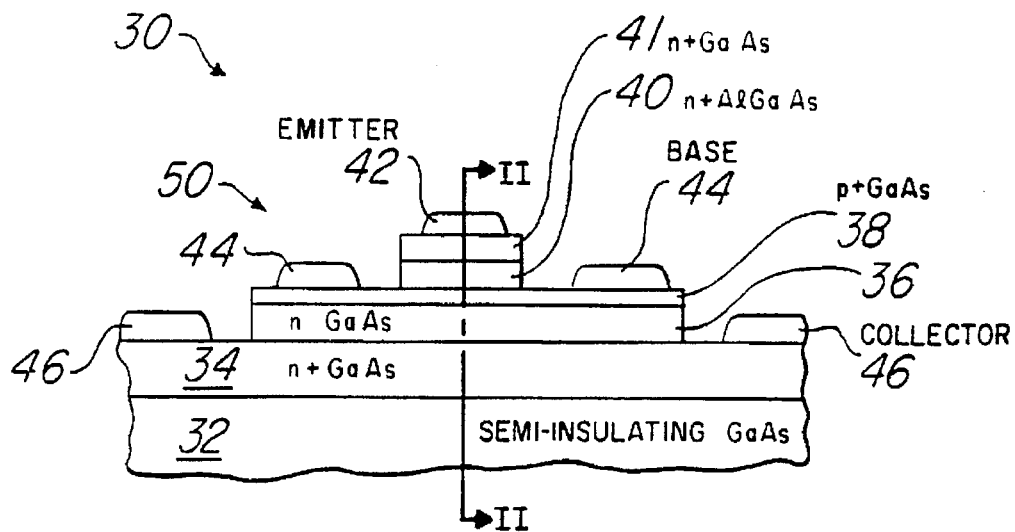
FIGS. 1a–c are cross sectional elevation view, composition profile, and band diagram under bias for a known hereto junction bipolar transistor.

FIG. 1a illustrates in cross sectional elevation view a Ion own heterojunction bipolar transistor (HBT), generally denoted 30, which includes semi-insulating gallium arsenide (GaAs) substrate 32, $n^+$ GaAs sub collector layer 34, n GaAs collector 36, $p^{3o}$ GaAs base 38, $n^+$ aluminum gallium arsenide ($Al_{0.3}Ga_{0.7}As$) emitter 40, $n^+$ GaAs emitter cap 41, emitter contact 42, base contacts 44, and collector contacts 46. HBT 30 could be a component of an integrated circuit with many other components such as other HBTs or active devices together with passive components such as capacitors, resistors, inductors, transmission lines, couplers, and so forth. Isolation, passivation, leads, packaging, and so forth are not shown for clarity.

Emitter 40 is typically in the range of 1 to 50 µm square with the base and collector correspondingly larger. Note that $h_{fe}$ decreases with decreasing size of emitter 40. This scaling dependence of $h_{fe}$ appears to be due to recombination current at the emitter periphery, but a compositional grading of the base seems to overcome the dependence; see, T. Izawa et al, AlGaAs/GaAs Heretojunction Bipolar Transistors, 1985 IEDM Tech. Dig. 328. The thicknesses and doping levels of the elements of device 30 are typically as follows:

| Element | Material | Thickness (Å) | Doping (cm$^{-3}$) |
|---|---|---|---|
| Emitter Cap | GaAs | 1,500 | $5 \times 10^{18}$ |
| Emitter | $Al_{0.3}Ga_{0.7}As$ | 1,000 | $2 \times 10^{17}$ |
| Base | GaAs | 1,000 | $1 \times 10^{19}$ |
| Collector | GaAs | 5,000 | $2 \times 10^{16}$ |
| Subcollector | GaAs | 10,000 | $5 \times 10^{18}$ |

Figure 1B:
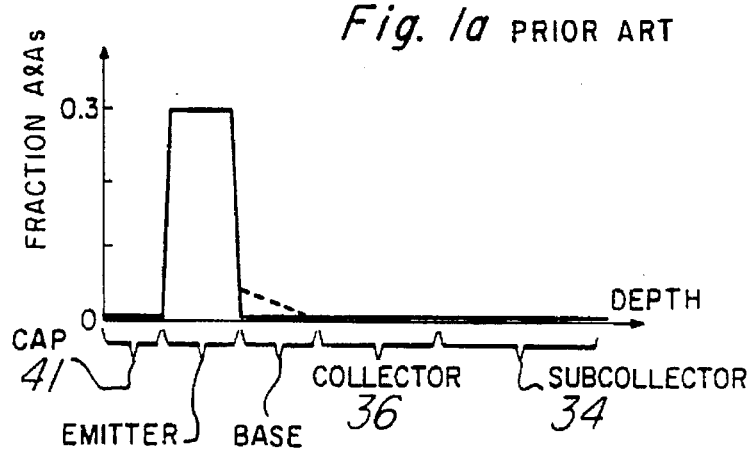

FIG. 1b is a composition profile along line B—B of FIG. 1a, and illustrates the fraction of aluminum arsenide; note that the heterojunctions (emitter/base and emitter cap/emitter) have a graded composition over a short distance (e.g., 100 Å) to avoid discontinuities in the conduction and valence band edges. The broken line indicates the composition for a graded base.

Figure 1C:
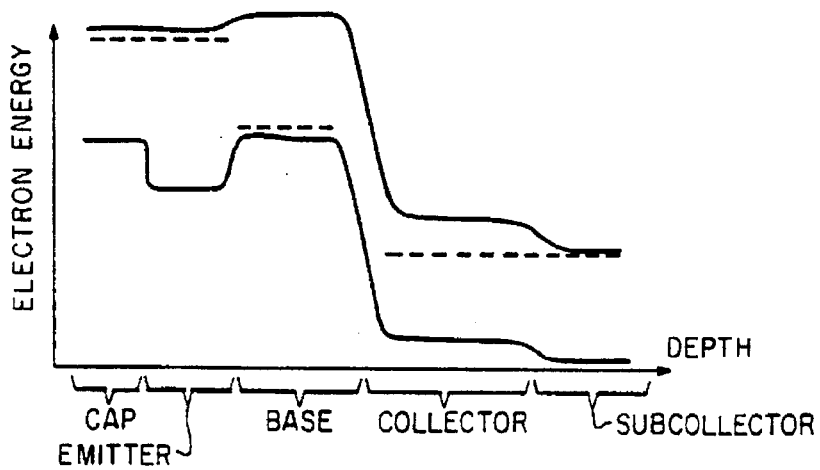

FIG. 1c is a conduction and valence band edge diagram for device 30 biased into the active region: forward bias on the emitter-base junction and reverse bias on the collector-base junction. The Fermi level in each of the layers is indicated by a broken line. The advantage of the emitter-base heterojunction is apparent in the large barrier to hole injection from the base into the emitter; this allows a heavily doped base together with high emitter efficiency.

Figure 2A:
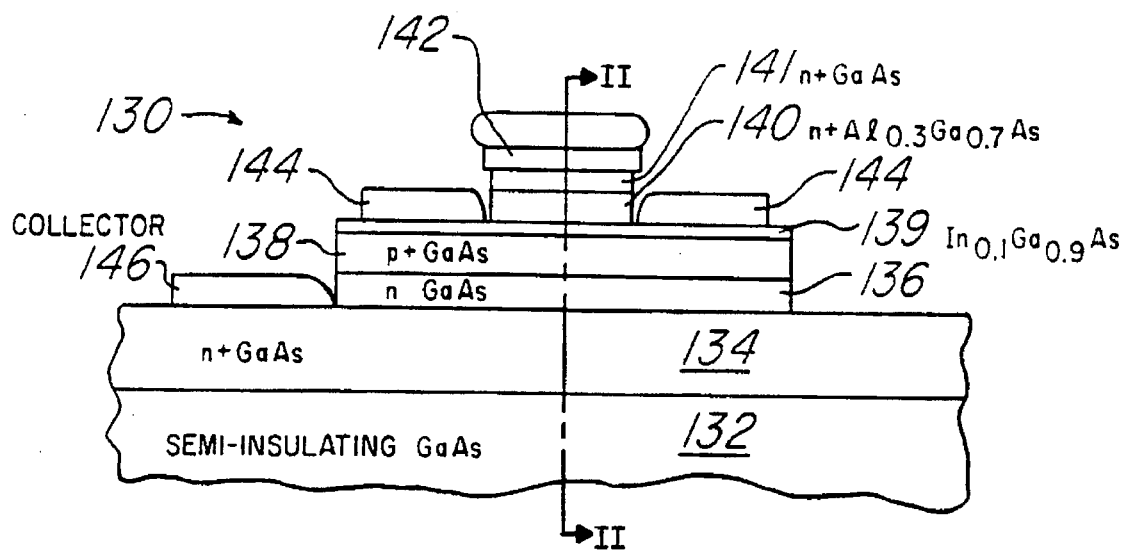
FIG. 2a–b are cross sectional elevation view and band diagram under bias for a first preferred embodiment heterojunction bipolar transistor.

First preferred embodiment heterojunction bipolar transistor, generally denoted 130, is illustrated in cross sectional elevation view in FIG. 2a and includes semi-insulating gallium arsenide (GaAs) substrate 132, $n^+$ GaAs subcollector layer 134, n GaAs collector 136, $p^+$ GaAs base layer 138 which includes $p^+$ indium gallium arsenide ($In_{0.1}Ga_{0.9}As$) etch-stop sublayer 139, n aluminum gallium arsenide ($Al_{0.3}Ga_{0.7}As$) emitter 140, $n^+$ GaAs emitter cap 141, emitter contact 142, base contacts 144, and collector contacts 146. As with HBT 30, HBT 130 could be a component of an integrated circuit, and isolation, passivation, leads, packaging, and so forth are not shown for clarity.

Emitter 140 is 2 µm by 20 µm with the base and collector correspondingly larger. The base consists of $In_{0.1}Ga_{0.9}As$ etch-stop sublayer 139 plus GaAs layer 138. The thicknesses and doping levels of the elements of device 130 are as follows:

| Element | Material | Thickness (Å) | Doping (cm$^{-3}$) |
|---|---|---|---|
| Emitter Cap | GaAs | 1,500 | $5 \times 10^{18}$ |
| Emitter | $Al_{0.3}Ga_{0.7}As$ | 1,500 | $2 \times 10^{17}$ |
| Etch Stop | $In_{0.1}Ga_{0.9}As$ | 100 | $1 \times 10^{19}$ |
| Base | GaAs | 1,000 | $1 \times 10^{19}$ |
| Collector | GaAs | 5,000 | $2 \times 10^{16}$ |
| Subcollector | GaAs | 10,000 | $5 \times 10^{18}$ |

Figure 2B:
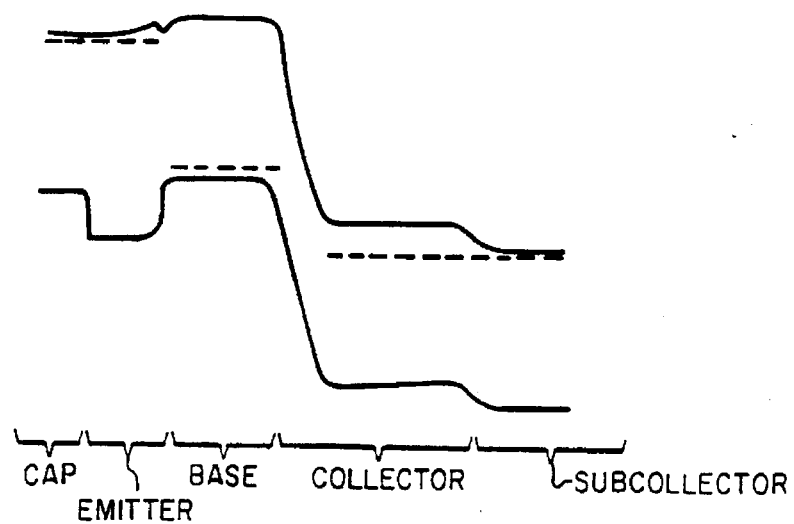

FIG. 2b is a conduction and valence band edge diagram for device 130 biased into the active region: forward bias on the emitter-base junction and reverse bias on the collector-base junction. As with HBT 30, HBT 130 has compositionally graded heterojunctions (emitter cap/emitter, emitter/etch stop, etch stop/base) to avoid discontinuities in the conduction and valence band edges; however, the smaller bandgap of etch-stop sublayer 139 still is apparent as a slight dip in the band edge. The Fermi level in each of the layers is indicated by a broken line, and shows the small electrical effect of $In_yGa_{1-y}As$ sublayer 139 in GaAs base 138. Compare FIG. 2b with FIG. 1c.

Figure 3A:
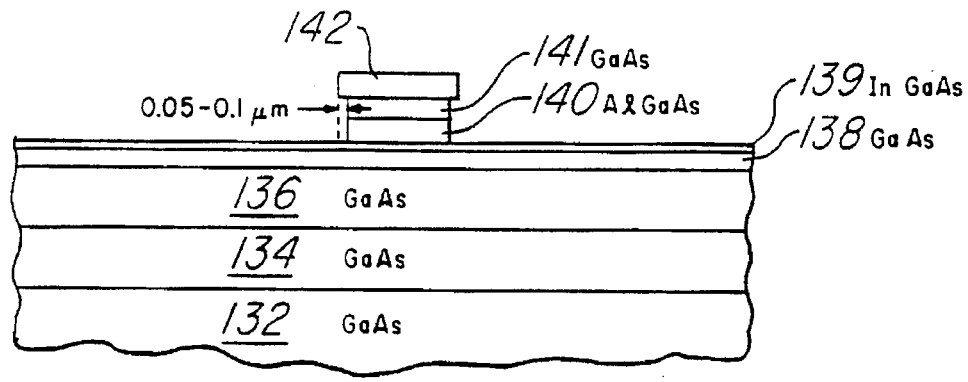
FIGS. 3–c illustrate steps in a first preferred embodiment method of fabrication of the first preferred embodiment transistor.
Figure 3B:
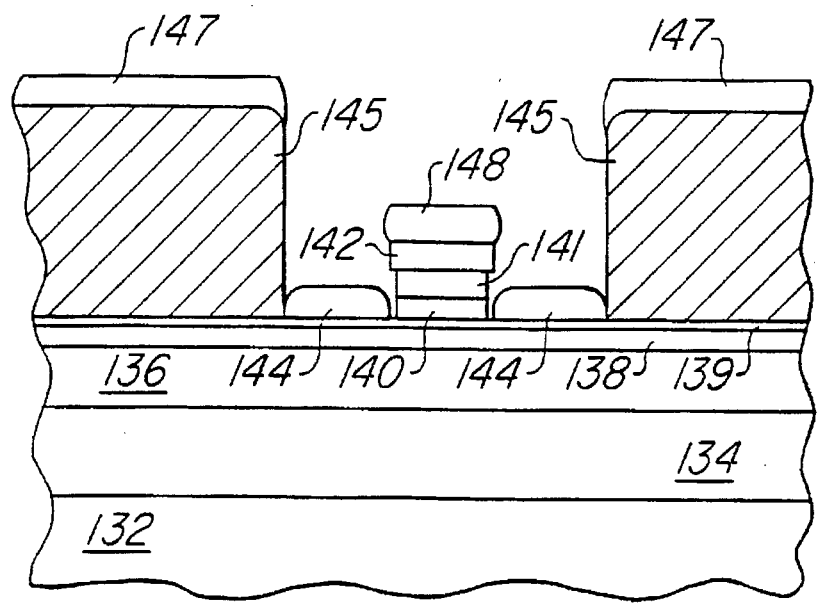

Further characteristics and features of device 130 are apparent from the first preferred embodiment method of fabrication, which includes the following steps and is illustrated in FIGS. 3a–b:

(a) MBE or MOCVD is used to grow six layers on a semi-insulating GaAs substrate; the first layer grown is 10,000 Å thick GaAs doped with silicon to $5 \times 10^{18}/cm^3$, the second layer is 5,000 Å thick GaAs doped with silicon to $2 \times 10^{16}/cm^3$, the third layer is 1,000 Å thick GaAs doped with beryllium in the case of MBE and with zinc in the case of MOCVD to $1 \times 10^{19}/cm^3$, the fourth layer is 100 Å thick $In_{0.1}Ga_{0.9}As$ doped with beryllium to $1 \times 10^{19}/cm^3$ (or optionally undoped), the fifth layer is 1,000 Å thick $Al_{0.3}Ga_{0.7}As$ doped with silicon to $2 \times 10^{17}/cm^3$, and the sixth layer is GaAs doped with silicon to $5 \times 10^{18}/cm^3$. Photoresist (or electron beam resist) is spun on and an opening patterned to locate emitter 140. The patterned resist is used to deposit emitter contact 142 by evaporation of 500 Å of gold:germanium, 140 Å of nickel, and 3,000 Å of gold and lift-off. Emitter contact 142 is used as a mask for plasma etching of the fifth and sixth layers with $BCl_3$ to form emitter 140 plus emitter cap 141. The etching may be with a total pressure of 95 mtorr, power density of 0.25 watt/cm$^2$, and $BCl_3$ flow of 140 sccm. Under these conditions GaAs and $Al_xGa_{1-x}As$ etch at about 1,000 Å/min and generally anisotropically, but the $In_yGa_{1-y}As$ apparently etches at less than 10 Å/min. See FIG. 3a and note that the etch is stopped at the fourth layer by the presence of In, and but an overetch allows a controlled undercut of emitter contact 142 so that emitter contact 142 has an overhang of about 0.05 to 0.1 µm.

(b) Base contacts 144 are formed by evaporation and liftoff of Zn:Au/Au or Ti/Pt/Au on $In_yGa_{1-y}As$ layer 139. This is a self-aligned process which uses emitter contact 142 as a part of the mask; FIG. 3b shows patterned photoresist 145 in place with Zn:Au/Au or TiPt/Au 147 prior to the lift-off. Note that the Zn:Au/Au or Ti/Pt/Au 148 intercepted by emitter contact 142 increases the thickness of the contact. Also, the presence of In in layer 139 lowers the contact resistivity of base contacts 144.

Figure 3C:
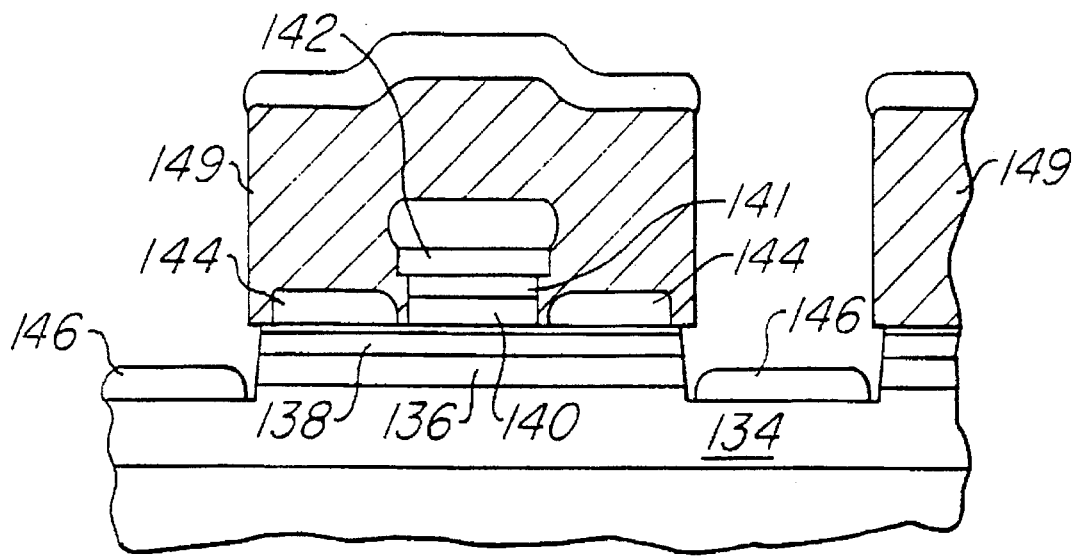

(c) Photoresist 149 is spun on and an opening patterned to locate collector contacts 146 (and the edge of collector 136 and base 138–139). The patterned photoresist 149 is used as a mask for wet etching with hydrogen peroxide plus sulfuric acid in water of the second, third, and fourth layers to form collector 136, base 138–139, and the collector contact area. See FIG. 3c and note that overetch into the first layer (subcollector) has little impact on device performance because the layer is thick and highly doped and not an active transistor element. Furthermore, the isotropy of the etch undercuts the patterned photoresist, and permits a self-aligned evaporation and lift-off of gold:germanium, nickel, and gold to form collector contact 146. FIG. 3c shows the process with photoresist 149 still in place prior to the lift-off.

Figure 4:
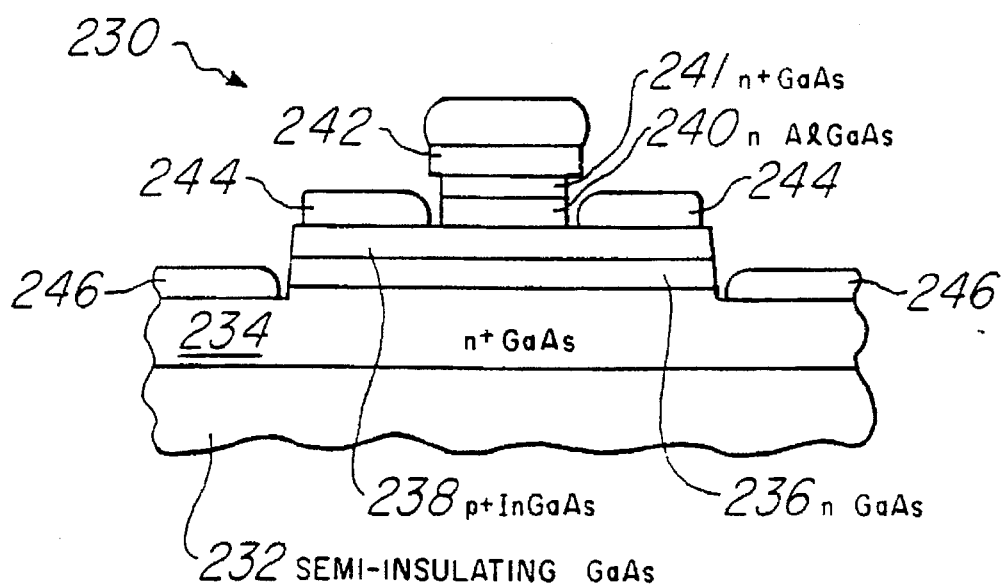
FIG. 4 is a cross sectional elevation view for a second preferred embodiment heterojunction bipolar transistor.

Second preferred embodiment HBT, generally denoted 230, is illustrated in cross sectional elevation view in FIG. 4 and is similar to device 130 but with base 138–139 replaced by base 238 which consists of an $In_yGa_{1-y}As$ layer of thickness 1,000 Å and with y=0.05. The base doping is beryllium or zinc at a concentration of $5\times10^{19}$ to $5\times10^{20}$/ $cm^3$. Device 230 includes semi-insulating GaAs substrate 232, $n^{30}$ GaAs sub collector 234, n GaAs collector 236, $In_yGa_{1-y}As$ $p^+$ base 238, n $Al_{0.3}Ga_{0.7}As$ emitter 240, $n^+$ emitter cap 241, emitter contact 242, base contacts 244, and collector contacts 246. The indium content of base 238 improves the mobility of the carriers and lowers the contact resistance. However, the lattice constant of InAs (6.0584 Å) is quite a bit larger than that of GaAs (5.6533 Å) and AlAs (5.6605 Å), so the $In_yGa_{1-y}As$ layers must be thin and accommodate strain to preserve the lattice structure, and larger y values (up to 0.5) likely will require much thinner bases. Conversely, smaller y values permits thicker bases, and y values as small as 0.01 still provide the etch stop required. Indeed, base 238 with very small values of y could be considered GaAs that has been doped with In.

The second preferred embodiment HBT and integrated circuits including it may be fabricated by an analog of the first preferred embodiment self-aligned process.

Figure 5:
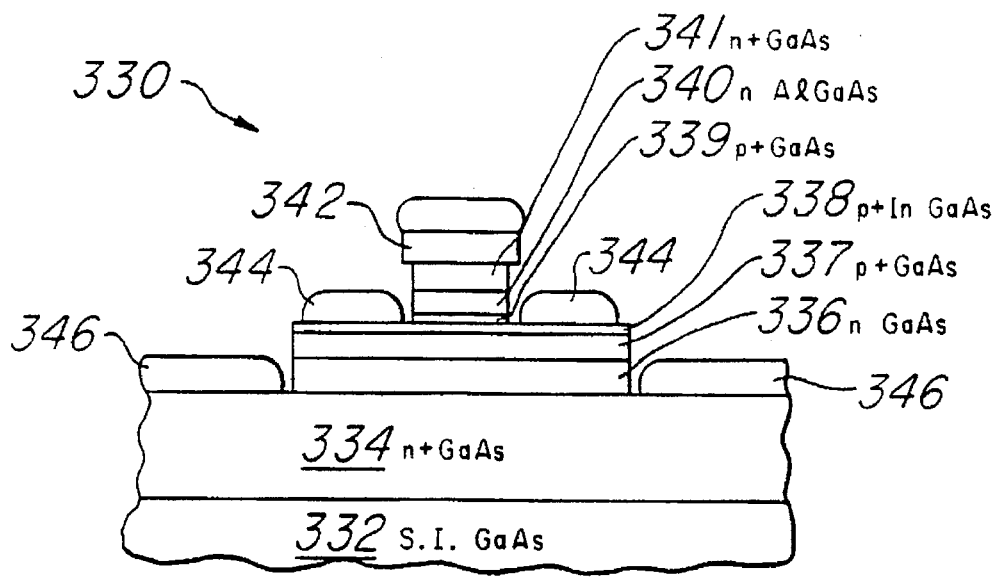
FIG. 5 is a cross sectional elevation view for a third preferred embodiment heterojunction bipolar transistor.

FIG. 5 shows in cross sectional elevation view third preferred embodiment HBT 330 which has an $In_yGa_{1-y}As$ etch stop layer embedded in the base rather than at the emitter/base heterojunction. HBT 330 semi-insulating gallium arsenide (GaAs) substrate 332, $n^+$ GaAs subcollector layer 334, n GaAs collector 336, $p^+$ GaAs base first sublayer 337 of thickness 800 Å, $p^+$ $In_{0.1}Ga_{0.9}As$ etch-stop sublayer 338 of thickness 100 Å, $p^+$ GaAs, base second sublayer 339 of thickness 100 Å, n $Al_{0.3}Ga_{0.7}As$ emitter 340, $n^+$ GaAs emitter cap 341, emitter contact 342, base contacts 344, and collector contacts 346. The heterojunctions have graded composition to avoid conduction and valence band discontinuities. As with the other preferred embodiments, HBT 330 could be a component of an integrated circuit, and isolation, passivation, leads, packaging, and so forth are not shown for clarity.

The base of HBT 330 consists of $In_{0.1}Ga_{0.9}As$ etch-stop sublayer 338 plus GaAs sublayers 337 and 339 on either side. During fabrication, which may follow the self-aligned first preferred embodiment method, the $BCl_3$ plasma etch removes all of sublayer 339 except that portion at the heterojunction with emitter 340. Thus the emitter/base heterojunction is slightly displaced from the exposed surface of base sublayer 339 with base contacts 344. This has the advantages of separating the base-emitter heterojunction from the exposed external base region without significant increase in base resistance because sublayer 339 is very thin.

Figure 6:
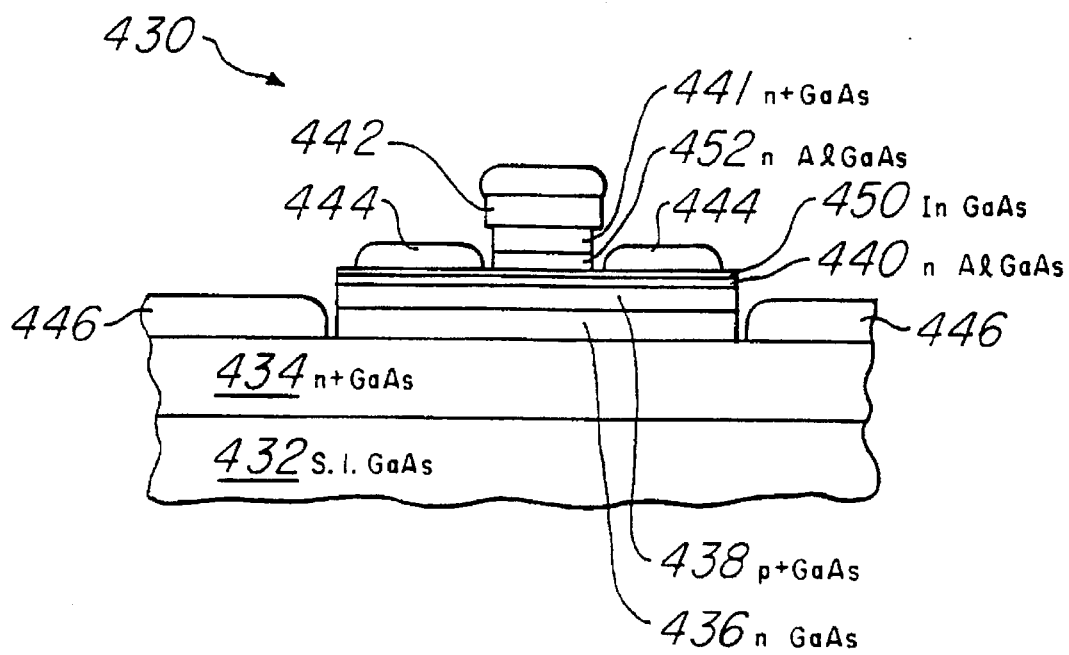
FIG. 6 is a cross sectional elevation view for a fourth preferred embodiment heterojunction bipolar transistor.

Fourth preferred embodiment HBT 430 is illustrated in FIG. 6 and has the $In_yGa_{1-y}As$ etch-stop layer embedded in the emitter to yield a recessed base. HBT 430 includes semi-insulating gallium arsenide (GaAs) substrate 432, $n^+$ GaAs subcollector layer 434, n GaAs collector 436, $p^+$ GaAs base 438 of thickness 1,000 Å, n $Al_{0.3}Ga_{0.7}$. As emitter first sublayer 440 of thickness 100 Å, undoped $In_{0.15}Ga_{0.85}As$ etch-stop sublayer 450 of thickness 100 Å, n $Al_{0.3}Ga_{0.7}As$ emitter second sublayer 452 of thickness 800 Å, $n^+$ GaAs emitter cap 441 of thickness 1,500 Å, emitter contact 442, base contacts 444, and collector contacts 446. Again, the heterojunctions have compositional grading to eliminate conduction and valence band discontinuities. As with the other preferred embodiments, HBT 430 could be a component of an integrated circuit, and isolation, passivation, leads, packaging, and so forth are not shown for clarity.

The emitter of HBT 430 consists of sublayer 452 plus adjacent portions of sublayers 450 and 440. The portions of sublayers 440 and 450 beneath base contacts 444 are consumed during the alloying process and effectively become a part of the contacts 444; the alloying process drives the Au/Zn in about 500 Å, which is sufficient to easily penetrate sublayers 440 and 450. And the portion of emitter sublayers 440 and 450 adjacent emitter sublayer 452 are in the emitter/base heterojunction depletion regions, so there is no short circuit created by base contacts 444. The advantages of having the emitter/base heterojunction below the exposed surface of etch-stop layer 450 include elimination of surface recombination which occurs in prior art HBT 30 at the exposed base 38 surface between the heterojunction (38–40) and the base contact 44; this permits large βs with small geometries. HBT 440 may be fabricated by the first preferred embodiment method of etching with $BCl_3$ and stopping on $In_yGa_{1-y}As$ emitter sublayer 450.

Figure 7:
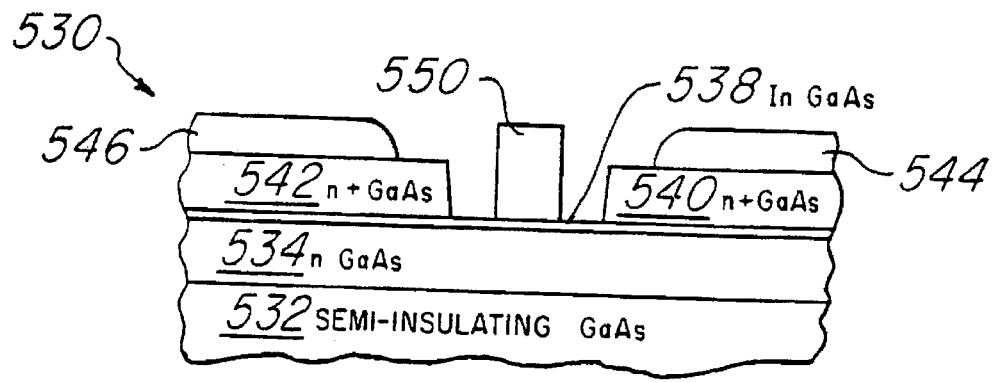
FIGS. 7–8 are cross sectional elevation views for fifth and sixth preferred embodiment MESFET and HEMT.

FIG. 7 shows a fifth preferred embodiment MESFET, denoted 530, in cross sectional elevation view. MESFET 530 includes semi-insulating GaAs substrate 532, n GaAs channel layer 534 of thickness 1,000 Å, undoped $In_yGa_{1-y}As$ etch-stop layer 538 of thickness 50 Å and with y=0.01, $n^+$ GaAs source and drain cap layers 540 and 542, source and drain ohmic contacts 544 and 546, and Ti/Pt/Au Schottky gate 550. Etch-stop layer 538 is very thin (conveniently between 25 and 100 Å) and has a low percentage of indium, so it will have little effect on carrier transport between channel 534 and source and drain caps 540 and 542. Further, etch-stop layer 538 permits a precise fabrication of MESFET 530 in that the thickness of channel layer 534 may be determined by an epitaxial growth of the layer and not by the local etch rate of the overlying cap layer as would be the case if no etch-stop layer were available. This has the advantage of yielding uniform threshold and pinchoff voltages across a wafer containing many MESFETs.

The gate 550 of MESFET 530 may be formed by a self-aligned process which etches the $n^+$ cap layer with a $BCl_3$ plasma through a patterned opening in a resist layer and then uses the same patterned resist to evaporate and lift-off the gate metal. Also, the gate may be formed directly on channel layer 534 by applying a short wet etch of the $In_yGa_{1-y}As$ etch-stop layer after the $BCl_3$ etch.

Figure 8:
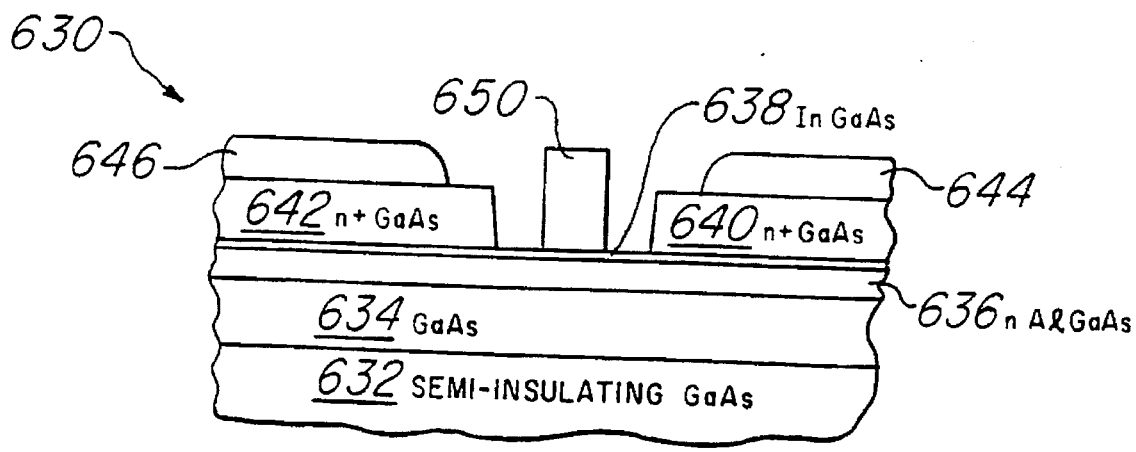

FIG. 8 shows sixth preferred embodiment HEMT, denoted 630, which includes semi-insulating GaAs substrate 632, undoped GaAs layer 634, n $Al_xGa_{1-x}As$ layer 636, undoped $In_yGa_{1-y}As$ etch-stop layer 638 of thickness 50 Å, $n^+$ GaAs source and drain caps 640 and 642, source and drain ohmic contacts 644 and 646, and Schottky gate 650. HEMT 630 operates by the conduction electrons from $Al_xGa_{1-x}As$ layer 636 diffusing to the heterojunction with undoped GaAs layer 634 and forming a two-dimensional electron gas at the GaAs side of the hereto junction; this two-dimensional electron gas acts as the HEMT conduction channel which is controlled by gate 650. As with MESFET 530, etch-stop layer 638 permits uniform threshold and pinchoff voltages of multiple HEMTs 630 across a wafer because the thickness of $Al_xGa_{1-x}As$ layer 636 under gate 650 is not determined by local etch rates of the $n^+$ capping layer or etching selectivity with respect to the $Al_xGa_{1-x}As$. Also as with MESFET 530, a self-aligned process for etching the $n^+$ cupping layer and depositing gate 650 may be used.

Figure 9:
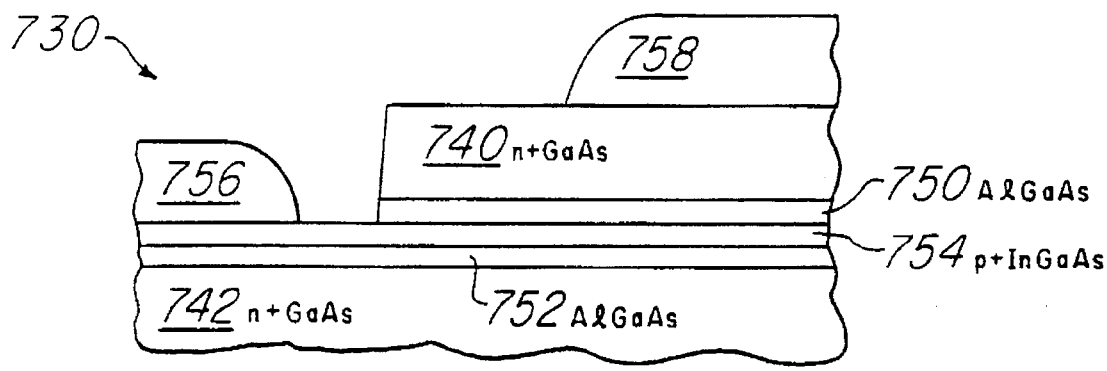
FIG. 9 is a cross sectional elevation view for a seventh preferred embodiment resonant tunneling transistor.

FIG. 9 illustrates a seventh preferred embodiment resonant tunneling transistor 730 which includes undoped $Al_xGa_{1-x}As$ tunneling barriers ($0.1 \leq x \leq 0.3$) 750 and 752 each of thickness 50 Å, $p^{30}$ $In_yGa_{1-y}As$ quantum well 754 of thickness 50 Å and with y=0.5, $n^+$ GaAs emitter 740, $n^+$ GaAs collector 742, quantum well metal contact 756, and emitter metal contact 758. Transistor 730 operates by a first bias being applied from emitter 740 to collector 742 and a second bias from emitter 740 to quantum well 754; the second bias adjusts the levels of the quantized subbands of the conduction band in quantum well 754. When a subband in quantum well 754 aligns with the Fermi level in emitter 740, resonant tunneling of electrons from emitter 740 through tunneling barrier 750 into the subband occurs and this greatly enhances the current from emitter 740 to collector 742. Thus transistor 730 is analogous to a bipolar transistor in that holes in the quantum well control an electron current passing through the quantum well.

Transistor 730 may be fabricated with the $BCl_3$ etch of the first preferred embodiment method. In particular, the structure of collector layer 742, tunneling barrier layer 752, quantum well layer 754, tunneling barrier layer 750, and emitter 740 may be grown by MBE or MOCVD. Then use $BCl_3$ to selectively etch GaAs 740 plus $Al_xGa_{1-x}As$ 750 and stop on $In_yGa_{1-y}As$ 754. Forming contact 756 to quantum well 754 is then simply evaporation without alloying due to the high In concentration. The thinness of layer 754 precludes timed etches that attempt to stop in the layer, but the preferred embodiment selective etch is extremely selective and can stop in the layer without penetrating into collector 742. Additionally, a passivant such as further $Al_xGa_{1-x}As$ or silicon dioxide or silicon nitride may be grown or deposited to cover the exposed portion of layer 754.

All of the preferred embodiments may be devices within integrated circuits which include other types of devices. For example, the HBTs could be the power devices of phased array radar modules which integrate power amplifiers, low noise amplifiers (possibly using MESFETs or HEMTs), digital control (possibly using HBTs) and transmit/receive switches and phase shifters (possibly using MESFETs or HEMTs).

MODIFICATIONS AND ADVANTAGES

Various modifications of the preferred embodiment devices and methods may be made while retaining the features of an incorporated etch stop.

Figure 10:
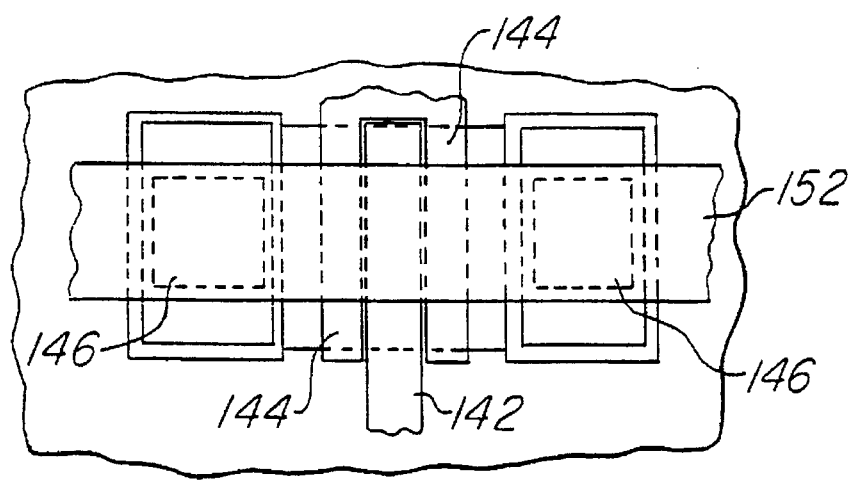
FIG. 10 is a plan view of an emitter structure usable with a modified preferred embodiment method of fabrication.

For example the $BCl_3$ etch could include diluents, the HBT, MESFET, and HEMT structures could be fabricated by non-self-aligned processing, p-n-p HBTs and p channel MESFETs and two-dimensional hole gas HEMTs may be included by varying the dopants or growing undoped epilayers and selectively doping them by diffusion or implantation; other semiconductor materials such as other III-V alloys without indium may be used outside of the etch stop and other indium III-V alloys may be used for the etch stop. The substrate may be GaAs-on-silicon or other compound structures; the bandgap of the base material may be graded to provide built-in acceleration of the minority carriers to the collector such as making the base of $Al_xGa_{1-x}As$ with x varying from 0.05 at the emitter to 0.0 at the collector; a wide-gate-recess etch for the MESFET may be used in which the $n^+$ layer is etched away with a first photoresist mask and then the gate applied with a second photoresist mast to etch into the channel; and the element shapes, dimensions, topologies, and topographies may be varied. Indeed, with an elongated emitter and base (see plan view in FIG. 10), the evaporation of metal to form base contacts 144 of the preferred embodiment self-aligned method may be modified and angled using the emitter structure 140, 141,142 as part of the mask to offset metal 144 from the emitter structure; the evaporation would require two evaporation steps: one for each side of the emitter structure and with no coverage at the ends of the emitter structure. This extra offsetting of metal 144 from the emitter structure lessens the leakage and shorts from emitter to base as the thicknesses of emitter 140, 141 and emitter contact 142 are decreased. FIG. 10 has the same reference numerals as FIG. 2a for the corresponding elements of HBT 130. Multiple parallel emitters could be used with the collector contacts connected by air bridges similar to air bridge 152 connecting collector contacts 146 in FIG. 10.

Advantages of the preferred embodiments include simplicity of fabrication plus uniformity of threshold and pinchoff voltages.

What is claimed is:

1. A method of fabrication of a semiconductor device, comprising the steps of:

(a) forming a layered structure with layers corresponding to elements of a device plus an etch stop layer, said etch stop layer of dimensions to avoid disruption of operation of said device;

(b) etching at least one of said layers and stopping said etch on said etch stop layer; said (c) formation of said elements of said device and wherein: said layers include $Al_xGal_{1-x}As$ and GaAs; said etch stop layer includes $In_yGa_{1-y}As$; and said etching includes plasmas with species derived from $BCl_3$.

2. A method of fabrication of a semiconductor device, comprising the steps of:

(a) forming a layered structure with layers including $Al_xGal_{1-x}As$ and GaAs corresponding to elements of a device plus an etch stop layer including $In_yGa_{1-y}As$ said etch stop layer of dimensions to avoid disruption of operation of said device;

b) etching by plasmas with species derived from $BCl_3$ at least one of said layers and stopping said etch on said etch stop layer; and (c) formation of said elements of said device.

* * * * *